United States Patent
Novack et al.

(10) Patent No.: US 10,901,150 B2
(45) Date of Patent: Jan. 26, 2021

(54) METAL CONTACT FREE PHOTODETECTOR WITH SIDEWALL DOPING

(71) Applicant: Elenion Technologies, LLC, New York, NY (US)

(72) Inventors: Ari Novack, New York, NY (US); Yaojia Chen, Jersey City, NJ (US)

(73) Assignee: Elenion Technologies, LLC, New York, NY (US)

( * ) Notice: Subject to any disclaimer, the term of this patent is extended or adjusted under 35 U.S.C. 154(b) by 6 days.

(21) Appl. No.: 16/439,463

(22) Filed: Jun. 12, 2019

(65) Prior Publication Data
US 2020/0393618 A1 Dec. 17, 2020

(51) Int. Cl.
| | |
|---|---|
| *G02B 6/122* | (2006.01) |
| *H01L 31/028* | (2006.01) |
| *H01L 31/107* | (2006.01) |
| *G02B 6/12* | (2006.01) |

(52) U.S. Cl.
CPC .......... *G02B 6/1225* (2013.01); *H01L 31/028* (2013.01); *H01L 31/107* (2013.01); *G02B 2006/1213* (2013.01); *G02B 2006/12138* (2013.01)

(58) Field of Classification Search
CPC .. G02B 2006/1225; G02B 2006/12138; G02B 2006/1213; H01L 31/12; H01L 31/16; H01L 31/028; H01L 31/107; H04N 2201/02429; G01J 2001/446; G01T 1/248
See application file for complete search history.

(56) References Cited

U.S. PATENT DOCUMENTS

2019/0378949 A1* 12/2019 Simoyama ............ H01L 31/105

\* cited by examiner

*Primary Examiner* — Armando Rodriguez
(74) *Attorney, Agent, or Firm* — Stratford Managers Corporation (57) ABSTRACT

A metal-contact-free photodetector includes an optically absorbing material, e.g. germanium, mounted on a device layer of a photonic integrated circuit, which includes a p-type contact and an n-type contact on opposite sides of a waveguide. The contacts are comprise of a plurality of independently doped regions ranging from lowest doped adjacent the waveguide to highest doped remote from the waveguide. An additional element is to add p and/or n doping on one or more of the sidewalls of the optically absorbing material, e.g Germanium. The advantage compared to the previously disclosed metal-contact-free photodetectors is that the bandwidth is much higher, and full speed is attained at lower voltage.

20 Claims, 10 Drawing Sheets

METAL CONTACT FREE PHOTODETECTOR WITH SIDEWALL DOPING

TECHNICAL FIELD

The present invention relates to an optical photodetector, and in particular to a metal-contact-free photodetector with sidewall doping.

BACKGROUND

Silicon-based components are attractive for low-cost photonic integrated circuits (PICs) because of their transparency in the telecommunications wavelength bands near 1310 nm and 1550 nm, and silicon is an excellent material for manufacturing low-loss passive optical components. However, for the same reason, silicon is typically not a suitable material for sources and detectors, and photodetector fabrication normally requires the integration of either group III/V semiconductor materials or germanium.

Figure 1:
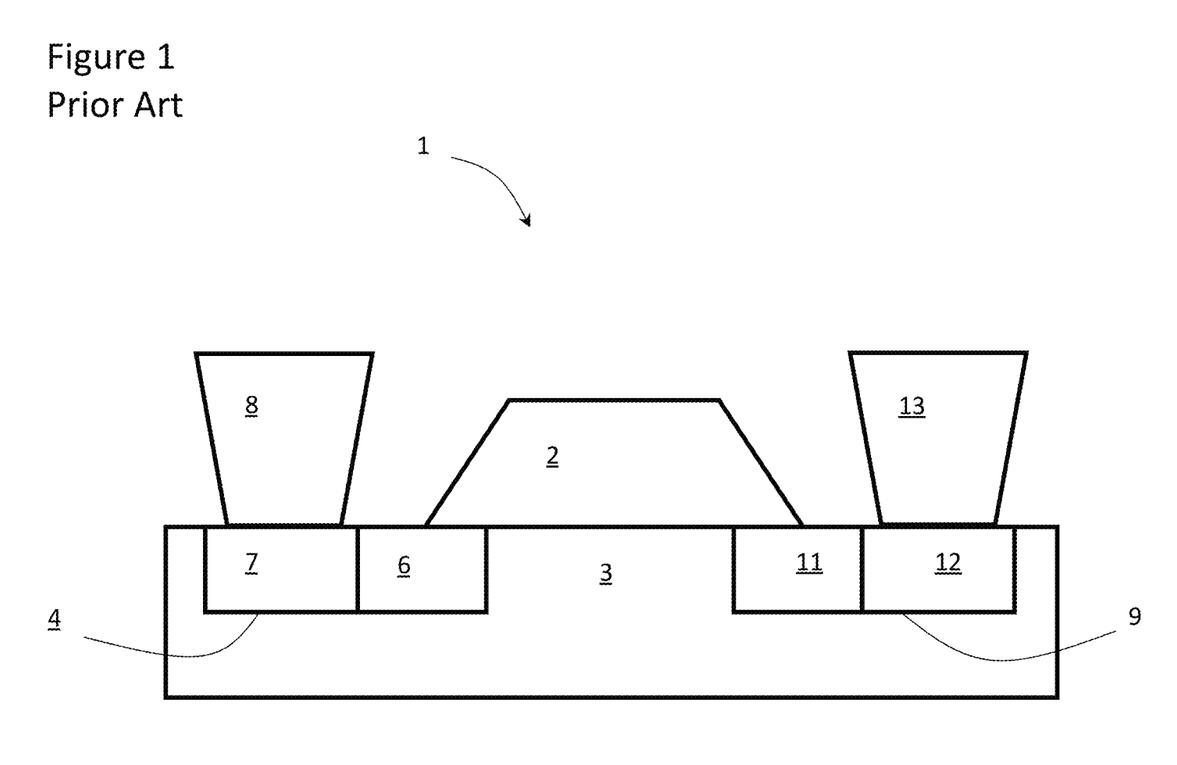
FIG. 1 is a cross-sectional view of a conventional photodetector.

Conventional semiconductor photodetectors require metal contacts on the semiconductor absorbing material to form p-i-n junctions. However, due to the light absorption of the metal contact, the responsivity is relatively low. A metal-contact-free photodetector, such as the one disclosed in U.S. Pat. No. 9,437,759 issued Sep. 6, 2016 in the name of Baehr-Jones et al, solved this problem by using a lateral silicon p-i-n structure with the semiconductor, e.g. germanium, absorbing material sitting on intrinsic silicon remote from the metal terminals. The photodetector 1 includes a semiconductor absorbing body 2 mounted on a semiconductor waveguide 3. The absorbing body 2 is capable of converting optical signals into electrical signals. A first doped, e.g. p-type, semiconductor contact 4 is provided on one side of the waveguide 3, comprising a first portion 6 under and in contact with the body 2, and a second portion 7 adjacent to the first portion remote from the body 2. The second portion 7 may have a higher doping level than the first portion 6. A first metal terminal 8 may be connected to second portion 7 for transmitting electrical signals to a remote control system. A second doped, e.g. n-type, semiconductor contact 9 is provided on an opposite side of the waveguide 3, comprising a first portion 11 under and in contact with the body 2, and a second portion 12 adjacent to the first portion remote from the body 2. The second portion 12 may have a higher doping level than the first portion 11. A second metal terminal 13 may be connected to second portion 12 for transmitting electrical signals to the remote control system.

Figure 2:
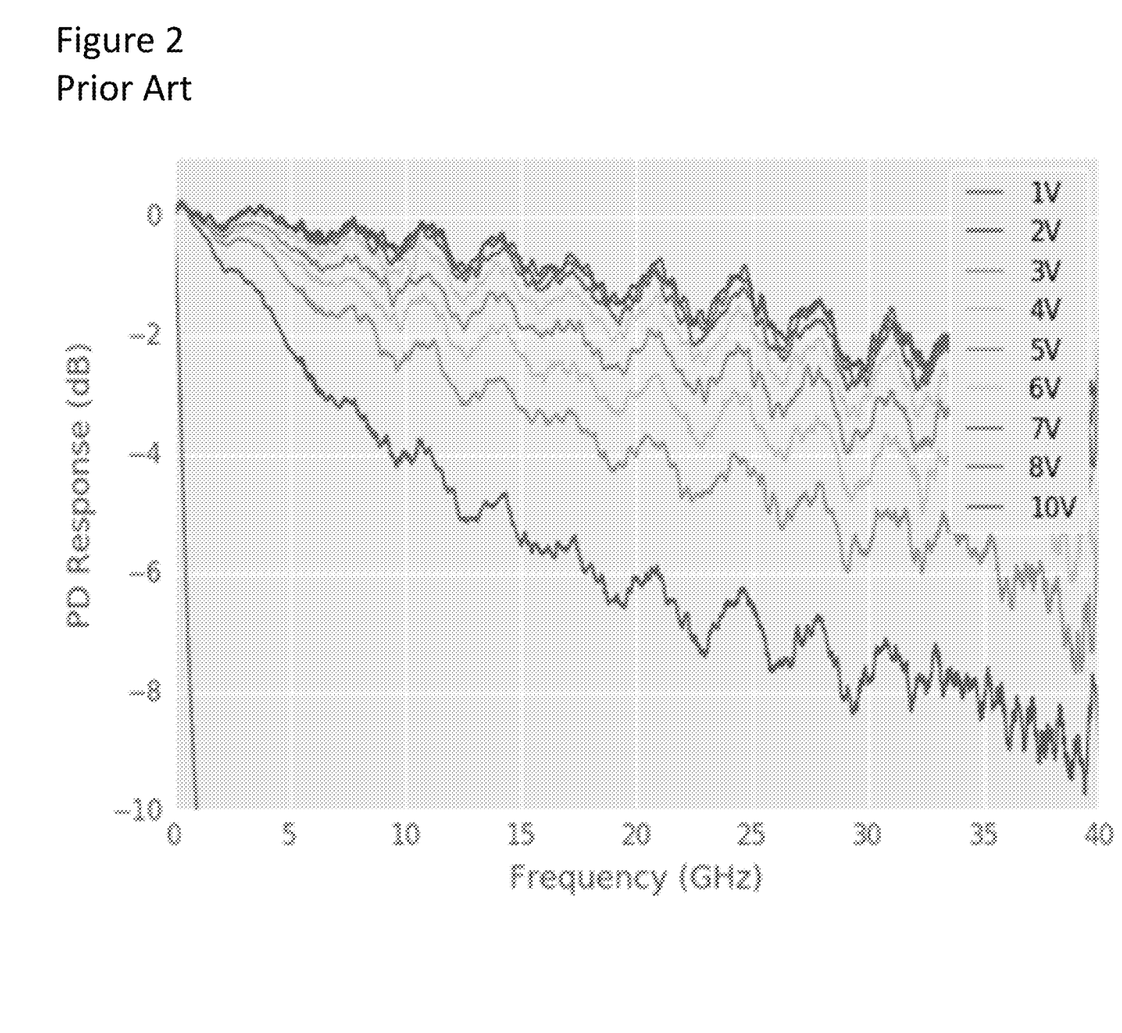
FIG. 2 is a plot of Frequency (GHz) vs PD Response (dB) for the photodetector of FIG. 1.

However, the aforementioned photodetectors require a relatively high operating voltage at high speeds, and only provide a relatively low bandwidth. FIG. 2 illustrates a conventional photodetector's response at high speeds for a range of voltages. The relatively low bandwidth of the previous metal-contact-free photodetector is limited by the long drift time of the photo-generated carriers, which is caused by the low electric field in the semiconductor, e.g. germanium. The long drift time of the photo-generated carriers may also explain the fact that the prior photodetectors need high voltage to achieve full speed.

An object of the present invention is to overcome the shortcomings of the prior art by providing a metal-contact-free photodetector requiring lower voltage and providing greater bandwidth.

SUMMARY OF THE INVENTION

Accordingly, the present invention relates to a photodetector comprising:

a waveguide absorption region for mounting in a device layer of a photonic integrated circuit (PIC) for transmitting an optical signal;

a first p-type contact in the device layer on one side of the waveguide absorption region, the first p-type contact comprising a first p-type portion including a first p-type doping concentration adjacent to the waveguide absorption region, and a second p-type portion including a second higher p-type doping concentration adjacent to the first p-type portion;

a second n-type contact in the device layer on an opposite side of the waveguide absorption region, the second n-type contact comprising a first n-type portion including a first n-type doping concentration adjacent to the waveguide absorption region, and a second n-type portion including a second higher n-type doping concentration adjacent to the first n-type portion;

an absorbing body on top of the waveguide absorption region for converting the optical signal to an electrical signal, the absorbing body including a first sidewall portion including a p-type dopant at least partially overlapping the first p-type portion, not in contact with the second p-type portion, and a second sidewall portion including an n-type dopant at least partially overlapping the first n-type portion, not in contact with the second n-type portion;

a first terminal extending from the second p-type portion for transmitting the electrical signal to external circuitry; and a second terminal extending from the second n-type portion for transmitting the electrical signal to external circuitry.

BRIEF DESCRIPTION OF THE DRAWINGS

The invention will be described in greater detail with reference to the accompanying drawings which represent preferred embodiments thereof, wherein.

DETAILED DESCRIPTION

While the present teachings are described in conjunction with various embodiments and examples, it is not intended that the present teachings be limited to such embodiments. On the contrary, the present teachings encompass various alternatives and equivalents, as will be appreciated by those of skill in the art.

Figure 3A:
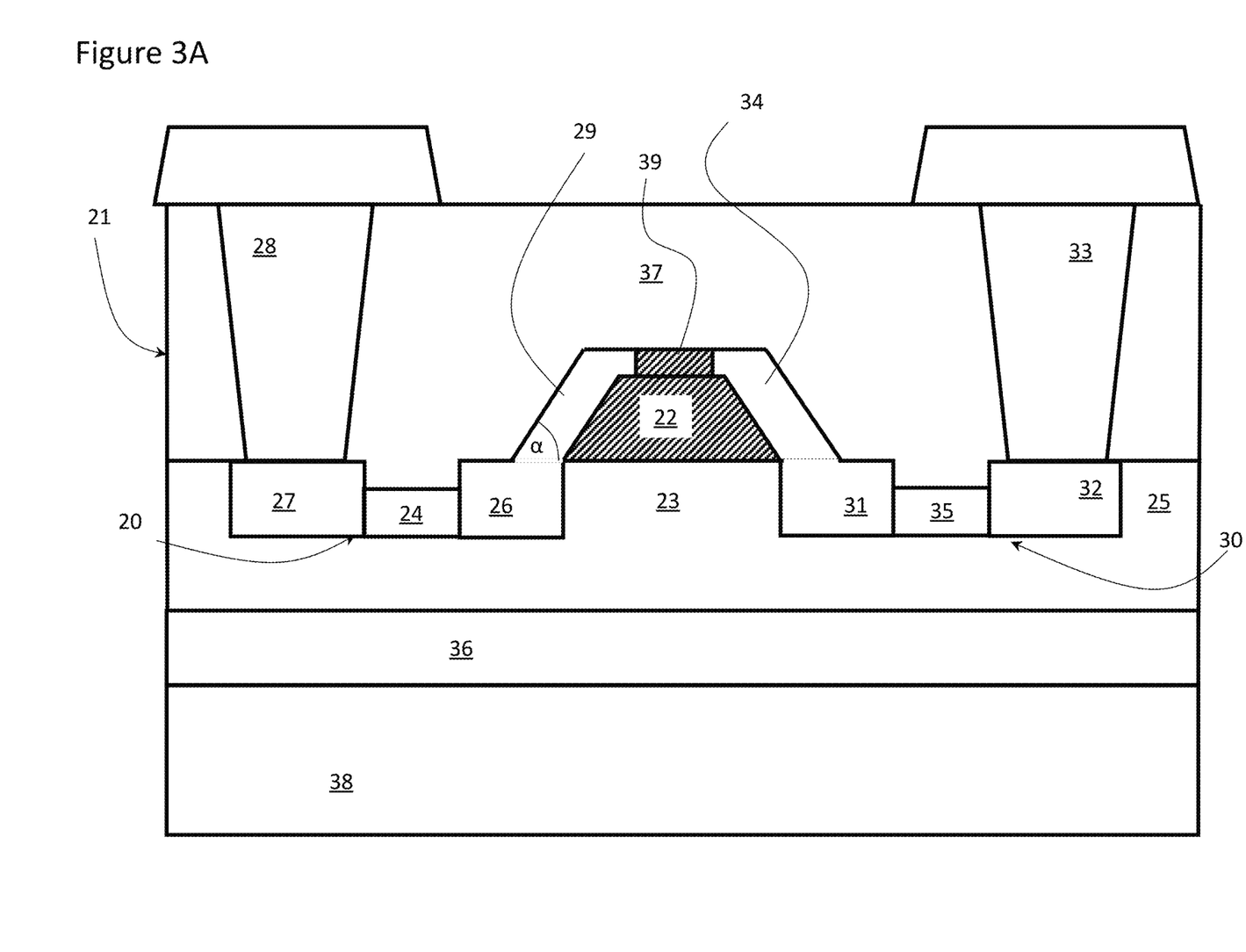
FIG. 3A is a cross-sectional end view of a photodetector in accordance with an embodiment of the present invention.
Figure 3B:
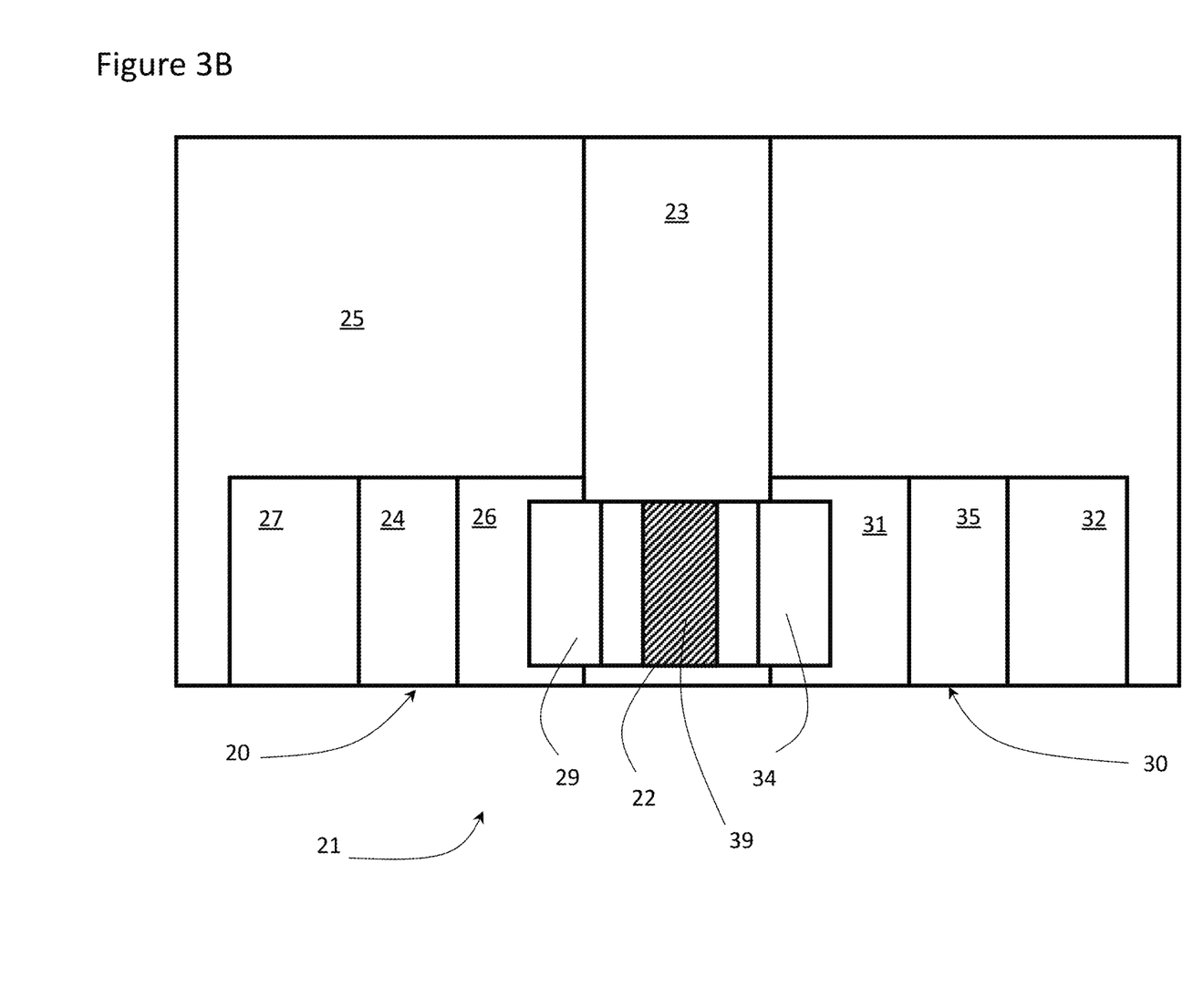
FIG. 3B is a top view of a photodetector in accordance with an embodiment of the present invention with the upper cladding and electrical terminals removed.

With reference to FIGS. 3A and 3B, a photodetector 21, in accordance with an exemplary embodiment of the present invention, includes an absorbing body 22, e.g. a semiconductor material such as germanium or a suitable group III-V semiconductor material, such as InGaAs, mounted on a waveguide absorption region 23, e.g. comprised of a semiconductor such as silicon or other suitable waveguide material. The absorbing body 22 may be comprised of an intrinsic, e.g. germanium, material. The waveguide absorption region 23 may be comprised of a slab waveguide, a ridge waveguide or a rib waveguide. The waveguide absorption region 23 may be formed in a device layer 25 of a photonic integrated circuit (PIC), which may include other optical components, e.g. light sources, optical filters etc. The absorbing body 22 is capable of converting optical signals transmitted along the waveguide absorption region 23, parallel to a longitudinal axis of the waveguide absorption region 23 extending into the page of FIG. 3A and parallel to the page of FIG. 3B, into electrical signals. The absorbing body 22 may comprise a triangular shaped structure, a pyramidal-shaped structure or a frustum-shaped structure with sidewall surfaces extending at an acute angle α, e.g. 20° to 60°, from the device layer 25.

A first doped, e.g. p-type, contact 20 may be provided on one side of the waveguide absorption region 23 in the device layer 25, comprising a first portion 26 under and in contact with the absorbing body 22, and a second portion 27 adjacent to the first portion 26 remote from the absorbing body 22. The first contact 20 may be comprised of the same material as the waveguide absorption region 23 doped with a suitable p or n type doping material, e.g. boron for p-type. The second portion 27 may have a higher, e.g. 5× to 20×, preferably 10×, doping level, e.g. $5\times10^{18}$ cm$^{-3}$ to $1\times10^{20}$ cm$^{-3}$, preferably $1\times10^{19}$ cm$^{-3}$, than the first portion 26. The first contact 20 may include a third slab portion 24, in between the first and second portions 26 and 27, respectively, with a doping level in between the first and second portions 26 and 27, respectively or the same as the second portion 27. The third slab portion 24 may have a depth shorter, e.g. ½× to ¾×, than the first and second portions 26 and 27 to increase optical mode confinement in the waveguide absorption region 23. A first metal terminal 28 may be connected to second portion 27 for transmitting electrical signals to a remote control system. Accordingly, the first metal terminal 28, is not in contact with the absorbing body 22 or the first p-type portion 26.

A first sidewall portion 29 of the absorbing body 22, above the first contact 20 and at least partially overalapping the first p-type portion 26, may also include the same doping material, e.g. p-type, as the first portion 26. Ideally, the first side wall portion 29 is doped at substantially the same doping concentration as the first portion 26, although a variation in doping levels between the first p-type portion 26 and the first side wall portion 29 is possible. If there is a variation, preferably the first side wall portion 29 comprises a higher doping concentration than the first p-type portion. The first sidewall portion 29 may extend from the second portion 26, i.e. an upper surface of the waveguide absorption region 23, to on top of the absorbing body 22. The depth of the first side wall portion 29 may extend from 20% to 35%, preferably 25% to 30%, of the width of the absorbing body 22.

A second doped, e.g. n-type, contact 30 is provided on an opposite side of the waveguide absorption region 23, comprising a first portion 31 under and in contact with the absorbing body 22, and a second portion 32 adjacent to the first portion remote from the absorbing body 22. The second contact 29 may be comprised of the same material as the waveguide absorption region 23 doped with a suitable p or n type doping material, e.g. phosphorous for n-type. The second portion 32 may have a higher, e.g. 5× to 20×, preferably 10×, doping level, e.g. $5\times10^{18}$ cm$^{-3}$ to $1\times10^{20}$ cm$^{-3}$, preferably $1\times10^{19}$ cm$^{-3}$, than the first portion 31. The second contact 29 may include a third slab portion 35, in between the first and second portions 31 and 32, respectively, with a doping level in between the first and second portions 31 and 32, respectively, or the same as the second portion 32. The third slab portion 35 may have a depth shorter, e.g. ½× to ¾×, than the first and second portions 31 and 32 to increase optical mode confinement in the waveguide absorption region 23. A second metal terminal 33 may be connected to second portion 32 for transmitting electrical signals to the remote control system. Accordingly, the second metal terminal 33 is not in contact with the absorbing body 22 or the first n-type portion 31. A second sidewall portion 34 of the absorbing body 22, above the second contact 29 and at least partially overalapping the first n-type portion 31, may also include the same doping material, e.g. n-type, as the first portion 31. Ideally, the second side wall portion 34 is doped at the same doping concentration as the first portion 31, although a variation in doping levels between the first n-type portion 31 and the second side wall portion 34 is possible. If there is a variation, preferably the second side wall portion 34 comprises a higher doping concentration than the first n-type portion. The second sidewall portion 34 may extend from the second portion 31, i.e. an upper surface of the waveguide absorption region 23, to on top of the absorbing body 22. The depth of the second side wall portion 34 may extend from 20% to 35%, preferably 25% to 30%, of the width of the absorbing body 22.

Ideally, an upper portion 39 of the absorbing body 22 extends in between the first and second sidewall portions 29 and 34, respectively, for separating the first and second sidewall portions 29 and 34. The upper portion 39 may be an intrinsic/undoped region inbetween the p-doped first side wall portion 29 and the n-doped second side wall portion 34, i.e. the i region in a lateral pin junction. The width of the upper region may be 30% to 60%, preferably 40% to 50% of the width of the absorbing body 22.

The waveguide absorption region 23 may be mounted on a lower cladding, e.g. SiO$_2$, layer 36, and covered by an upper cladding, e.g. a dielectric or oxide such as SiO$_2$, layer 37. The entire structure may be mounted on a substrate 38, e.g. silicon handle.

Figure 4:
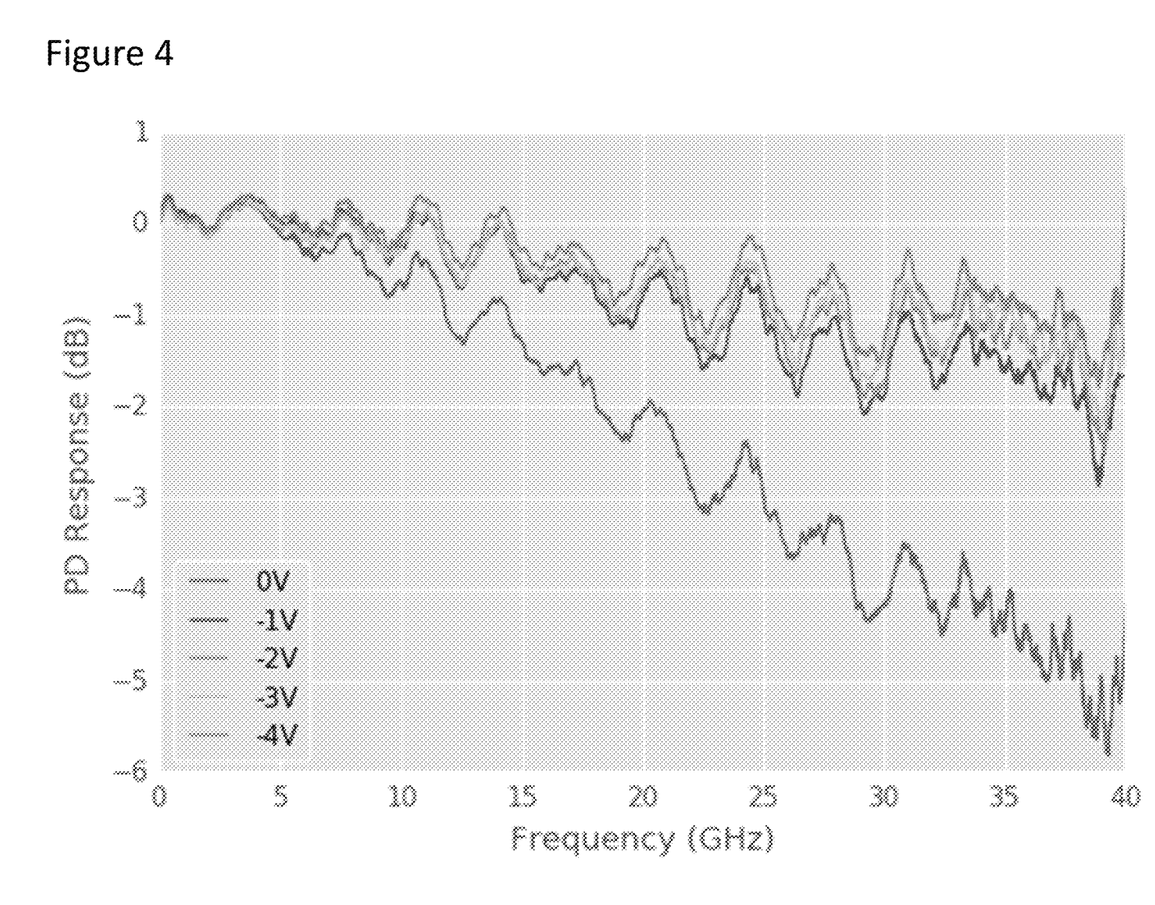
FIG. 4 is a plot of Frequency (GHz) vs PD Response (dB) for the photodetector of FIG. 3.

By adding p-type and n-type doping to the first and second sidewall portions 29 and 34, respectively, the electric field in the absorbing body 22 is high enough for the carriers to drift at saturation velocity even at low voltage, e.g. of around −1V. FIG. 4 illustrates the response for the photodetector 21 at a variety of voltages and frequencies. Furthermore, because the optical mode of the optical signal is mainly located at the center of the absorbing body 22, the optical loss from the sidewall doping is very small. The responsivity is similar to the previous Si-contact-free detector.

Figure 5:
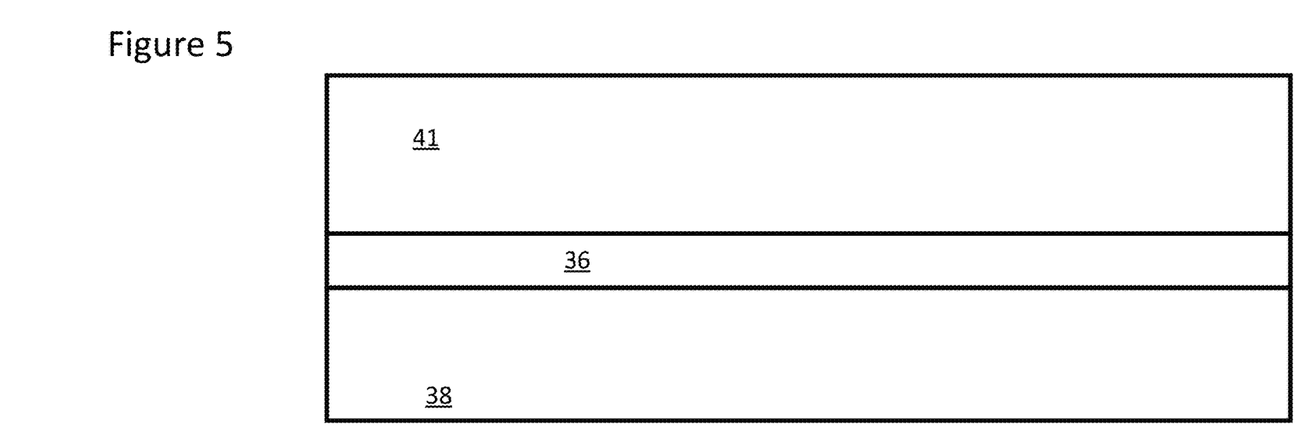
FIGS. 5-10 illustrate an exemplary method manufacture of the photodetector of FIG. 3.

A method of manufacturing the photodetector 21 is detailed in FIGS. 5-10. With reference to FIG. 5, a slab waveguide 41 is provided on the lower cladding layer 36 mounted on a substrate 38. In a preferred embodiment, this structure may be a silicon on insulator (SOI) structure with the slab waveguide 41 and the substrate 38 comprise of silicon, with am oxide layer, e.g. SiO$_2$, forming the lower cladding layer 36 therebetween.

Figure 6:
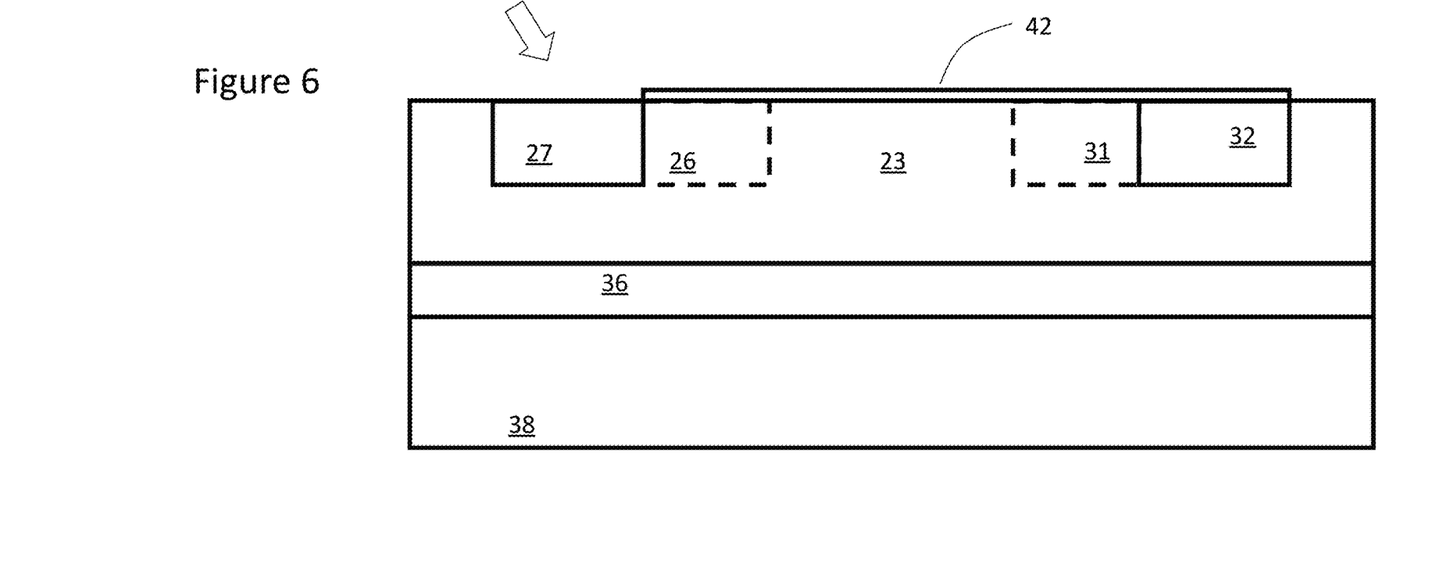

With reference to FIG. 6, the area above where the waveguide absorption region 23 and the first portion 26 of the first contact 20 and the first portion 31 of the second contact 30 are defined and protected by a masking layer 42, while the second portion 27 of the first contact 20 and the second portion 31 of the second contact 30 are alternatively masked and then doped, e.g. via ion implantation, with their respective p and n type doping material at the first doping concentration, e.g. $5 \times 10^{17}$ cm$^{-3}$ to $1 \times 10^{19}$ cm$^{-3}$, preferably $1 \times 10^{18}$ cm$^{-3}$.

Figure 7:
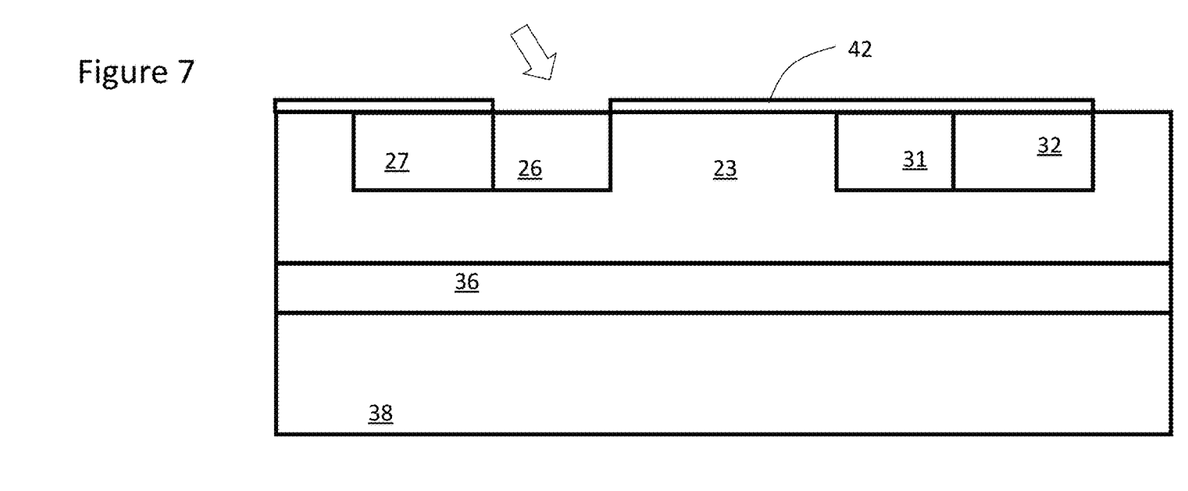

With reference to FIG. 7, the masking layer 42 above the first portion 26 of the first contact 20 and above the first portion 31 of the second contact 30 is removed, i.e. leaving the masking layer 42 above the waveguide absorption region 23, while the first portion 26 of the first contact 20 and the first portion 31 of the second contact 30 are alternatively masked and then doped with their respective p and n type doping material at the second, higher, doping concentration, e.g. 5× to 20×, preferably 10×, doping level, e.g. $5 \times 10^{18}$ cm$^{-3}$ to $1 \times 10^{20}$ cm$^{-3}$, preferably $1 \times 10^{19}$ cm$^{-3}$. The third portions 24 and 35 of the first and second contacts 20 and 30 may also be formed, e.g. etched down to ½ to ¾ of the height of the first and second portions 26, 27, 31 and 32, and then doped accordingly (same as doping levels of second portions 27 and 32 or inbetween doping levels of first 26 and 31 and second 27 and 32 portions, during the initial steps, if required.

Figure 8:
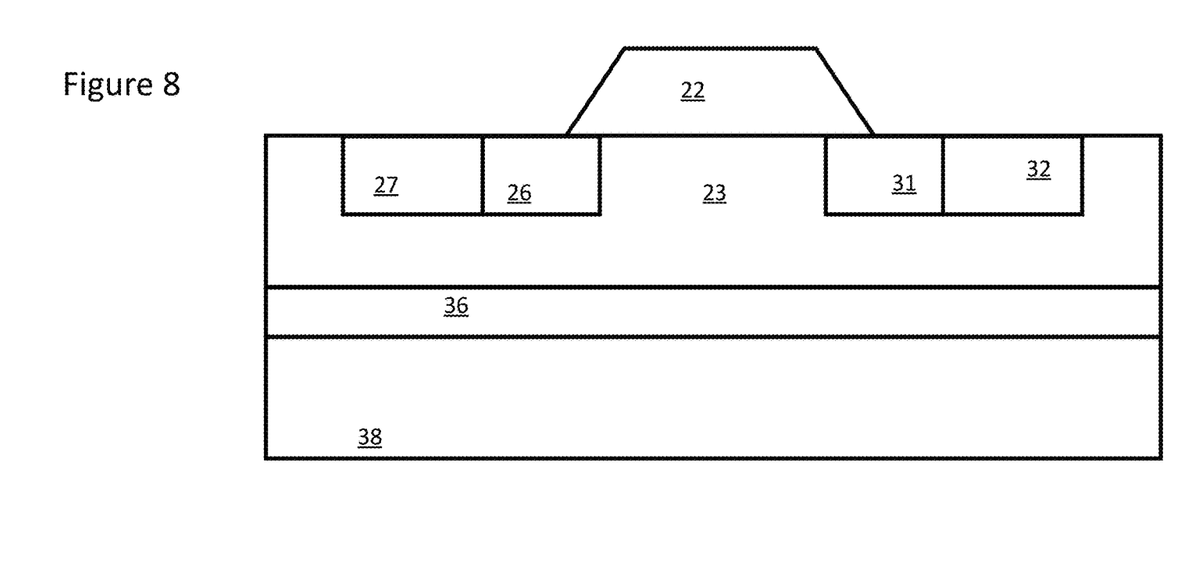

With reference to FIG. 8, the absorbing body 22 is mounted, e.g. deposited, over the waveguide absorption region 23, with the angled side wall portions overlapping the first portion 26 of the first contact 20 on one side, and the first portion 31 of the second contact 30 on the other opposite side.

Figure 9:
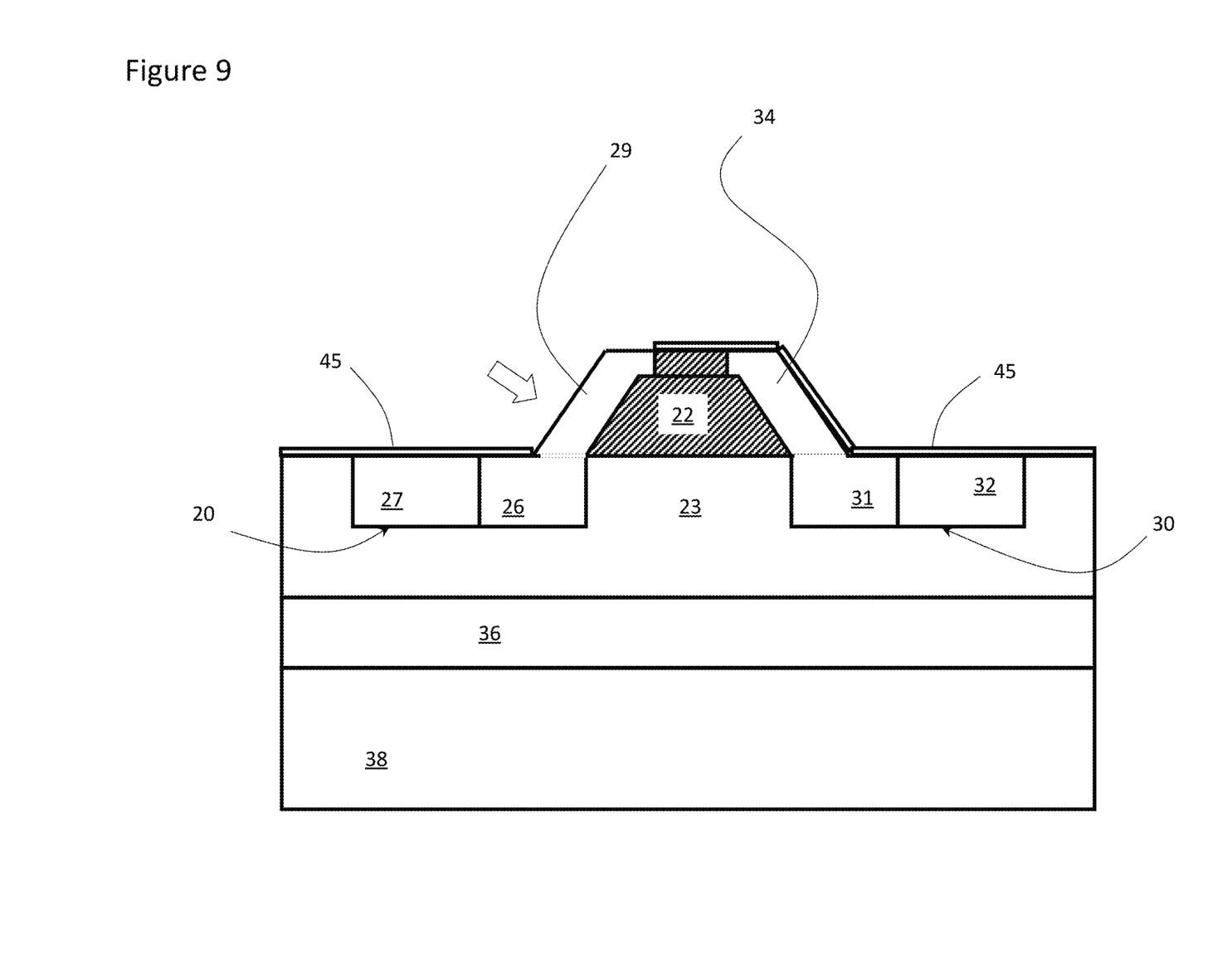

With reference to FIG. 9, the sidewalls 29 and 34 of the absorbing body 22 are alternatively masked, along with the other portions of the absorbing body 22 and the first and second contacts 20 and 30 not being doped, e.g. by mask 45, and then doped with the appropriate doping concentration.

Figure 10:
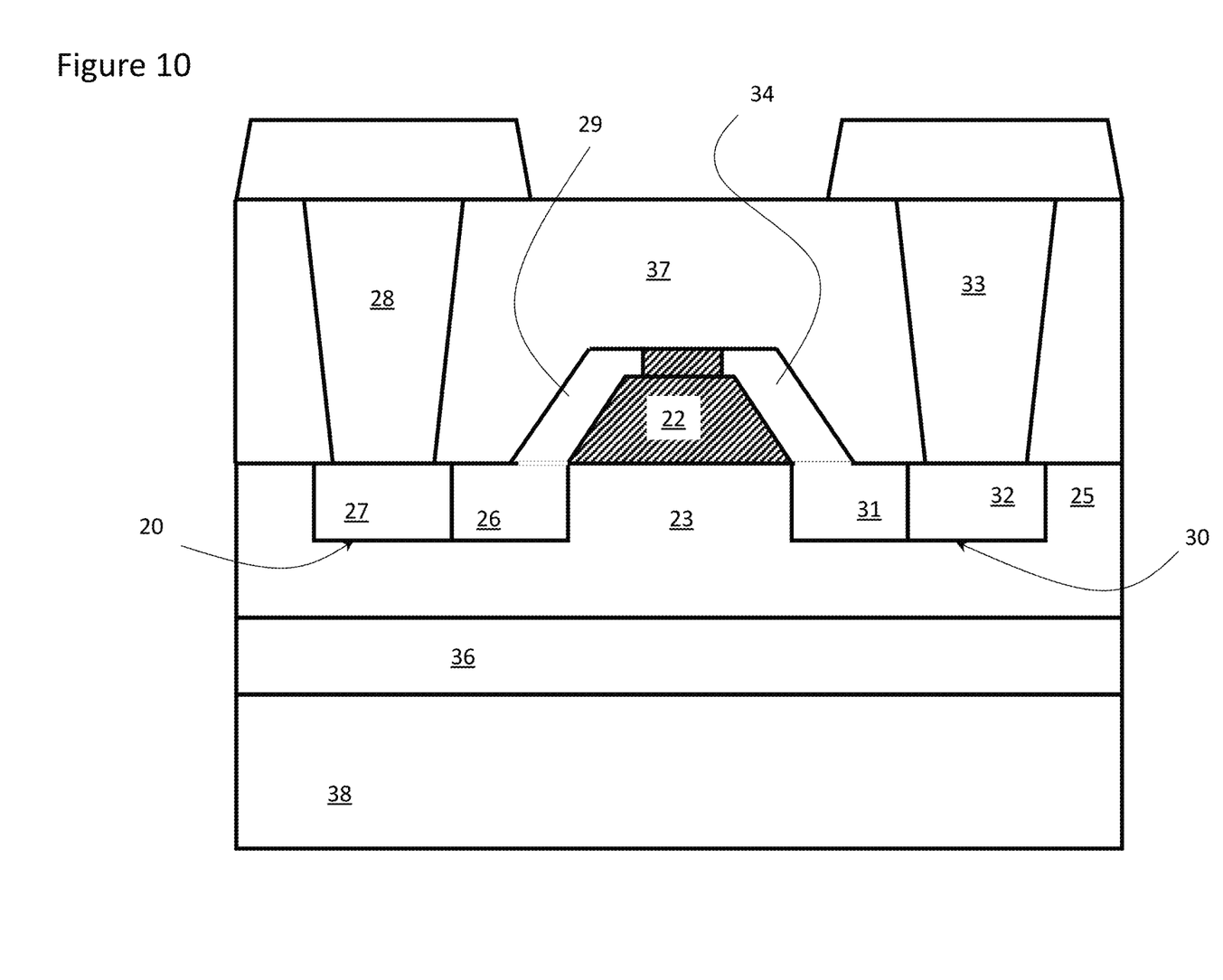

Finally, with reference to FIG. 10, the masks 45 are removed, and the first and second terminals 28 and 33, respectively are add, along with the upper cladding 37, e.g. an oxide such as SiO$_2$, covering the upper surfaces of the absorbing body 22 and the first and second contacts 20 and 30, respectively.

Figure 11:
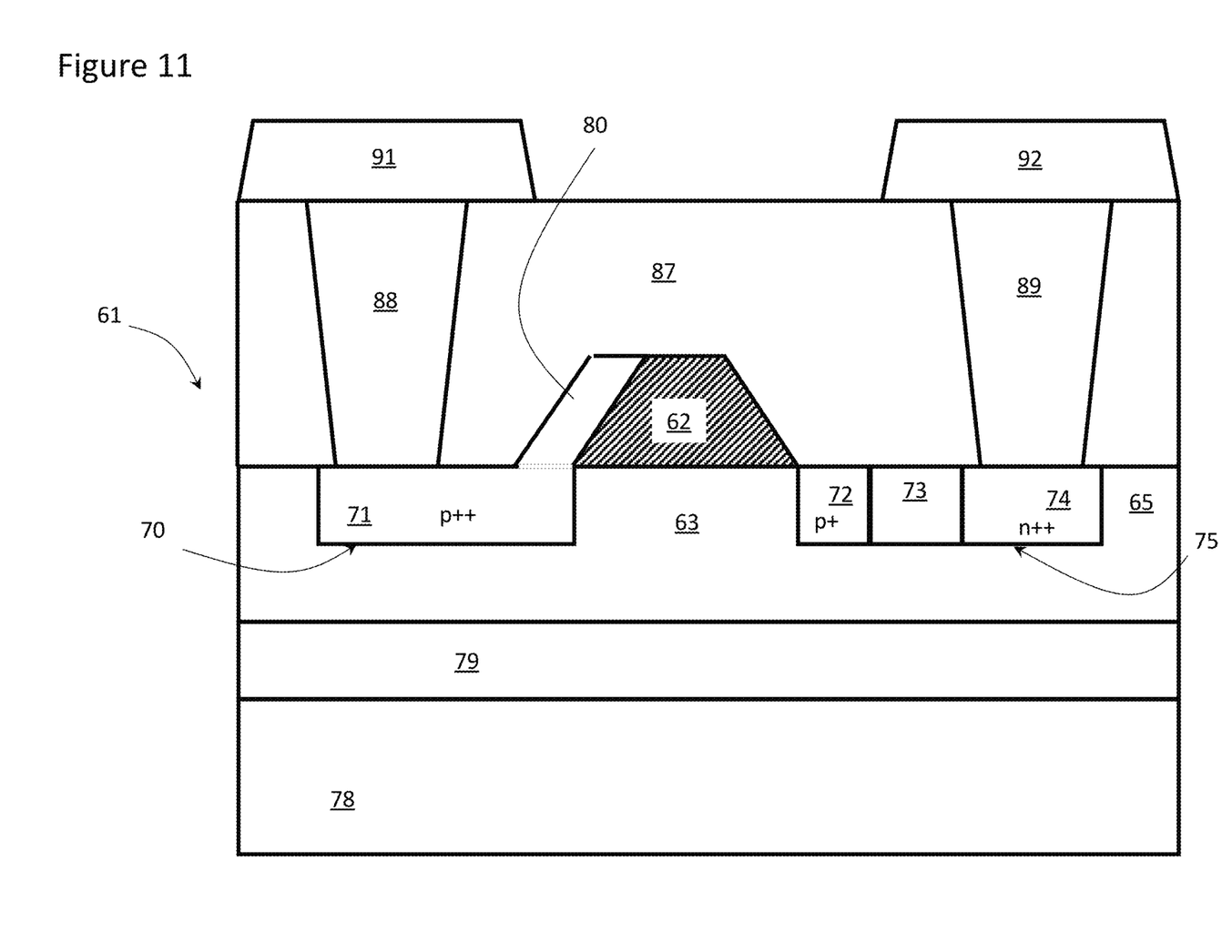
FIG. 11 illustrates an alternative embodiment of a photodetector of the present invention.

With reference to FIG. 11, a lateral avalanche photodiode (APD) 61 according to an embodiment of the invention, includes includes an absorbing body 62, e.g. a semiconductor material such as germanium or a suitable group III-V semiconductor material, such as InGaAs, mounted on a waveguide absorption region 63, e.g. comprised of a semiconductor such as silicon or other suitable waveguide material. The waveguide absorption region 63 may be comprised of a slab waveguide, a ridge waveguide or a rib waveguide. The waveguide absorption region 63 may be formed in a device layer 65 of a photonic integrated circuit (PIC), which may include other optical components, e.g. light sources, optical filters etc. The absorbing body 62 is capable of converting optical signals transmitted along the waveguide absorption region 63, parallel to a longitudinal axis of the waveguide absorption region 63 extending into the page of FIG. 11 and into electrical signals. The absorbing body 62 may be comprised of an intrinsic, e.g. germanium, material. The absorbing body 62 may comprise a triangular shaped structure, a pyramidal-shaped structure or a frustum-shaped structure with sidewall surfaces extending at an acute angle α, e.g. 20° to 60°, from the device layer 65. The discussion of how the absorbing body 62 may be fabricated is described in further detail in co-pending U.S. Pat. No. 9,437,759, which is incorporated herein by reference.

During germanium epitaxy, the growth rate is different at different crystal orientations. Growth in the <311> crystallographic direction may be slower than growth in the <100> crystallographic direction, thus a triangular (or non-planar) shape may be formed. As used herein, the < > notation is used to identify a family of equivalent directions, i.e. <100> includes the [100] direction, the [010] direction, the [001] direction and their opposite directions, such as [−100]).

In the device layer 65, a first doped contact 70 comprised of a first higher-doped portion 71, e.g. p++, is provided on one side of an absorption region of the waveguide absorption region 63, which itself may comprise a modest or no doping level. Adjacent to the waveguide absorption region 63 is a lesser, e.g. p+, doped charge region 72, doped with less dopant than the first higher-doped portion 71, e.g. ⅒×-¹⁄₁₀₀₀× less. Adjacent to the lesser doped charge region 72 is an avalanche region 73, including a modest or no doping level. Adjacent to the avalanche region 73 is a second higher-doped portion 74, e.g. n++, of a second contact 75 doped region 325. In some embodiments, the lesser p+ doping may be of the order of $1 \times 10^{15}$ to $1 \times 10^{17}$ cm$^{-3}$. In some embodiments, both the higher p++ and n++ doping are greater $1 \times 10^{18}$ cm$^{-3}$.

The device layer 65 may be fabricated on a substrate 78, such as a semiconductor wafer, or from other materials that are not semiconductors, such as quartz, aluminum oxide, sapphire, and the like. Ideally, the substrate 78 may be a layer of a silicon on insulator (SOI) wafer, which also includes a silicon dioxide (SiO$_2$) cladding layer 79 between the substrate 78 and the device layer 65.

The absorbing, e.g. germanium, body 62 may be deposited on top of the device layer 65, for example by epitaxy after all of the doped regions, i.e. 71-74, in the device layer 65 are completed. In some embodiments, the first higher-doped portion 71 may be in electrical contact with the absorbing body 62. In some embodiments, the absorption region of the waveguide absorption region 63 may be in electrical contact with the absorbing body 62. In some embodiments, the lesser-doped charge region 72 may be in electrical contact with the absorbing body 62. In other embodiments, the absorbing body 62 is not in mechanical contact with either of first higher-doped portion 71 and the lesser-doped charge region 72.

A first sidewall portion 80 of the absorbing body 62, above the first contact 70 and at least partially overalapping the first higher-doped, e.g. p++, portion 71, may also include the same doping material, e.g. p-type, as the first higher-doped portion 71. Ideally, the first side wall portion 80 is doped at substantially the same doping concentration as the first higher-doped portion 71, although a variation in doping levels between the first higher-doped portion 71 and the first side wall portion 80 is possible. If there is a variation, preferably the first side wall portion 80 comprises a higher doping concentration than the first higher-doped portion 71. The first sidewall portion 80 may extend from the first higher-doped portion 71, i.e. an upper surface of the device layer 65, to on top of the absorbing body 62. The depth of the first side wall portion 80 may extend from 20% to 35%, preferably 25% to 30%, of the width of the absorbing body 62.

In some embodiments, the modest doped regions, e.g. the waveguide absorption region 63 and the avalanche region 73, may include doping added simply as an artifact of the doping of nearby, or adjacent, regions. The doping may come about by inaccuracies in locating a dopant deposition or implantation or by diffusion of dopant during an annealing, activation or heat treatment step in the course of ordinary semiconductor processing. In some embodiments, the modest doped regions, e.g. regions 63 and 73 may have an effective doping that is lower than either the higher-doped, e.g. p++, portion 71 or the lesser-doped, e.g. p+, charge region 72. In some embodiments, the modest doped region, e.g. regions 63 and 73, may include an effective doping that is lower by approximately one order of magnitude than either the higher-doped, e.g. p++, portion 71 or the lesser-doped, e.g. p+ charge region 72. In some embodiments, the p-type dopant is boron (B). In some embodiments, the n-type dopants are one or more of phosphorus (P), arsenic (As) and antimony (Sb).

A cladding layer 87, e.g. a dielectric, such as an oxide like silicon dioxide, may be provided that covers the device layer 65 and the absorbing body 62. Ideally, there are no metal contacts made to the absorbing body 306. The electrical contacts to the absorbing body 62 are made by way of the, first contact 70, i.e. the higher doped, e.g. p++, portion 71, on one side and by way of the lesser-doped, e.g. p+, charge region 72 p+, the avalanche region 73 and the higher doped, e.g. n++ portion 74 of the second contact 75 on the other side. A voltage is applied to the device 61 such that the electrons that are generated in the absorbing body 62 are allowed to move into the waveguide absorption region 63, and then to the avalanche region 73, while the holes that are generated in the absorbing body 62 are allowed to move to the higher-doped, e.g. p++ portion 71 of the first contact 70. Electical conductors 88 and 89 extending through the cladding layer 87 are provided to connect the first contact 70 with a p terminal 91 and the second contact 75 with an n terminal 92, respectively, mounted on the cladding layer 87, so that the electrical signal generated in the APD 61 may be observed or used by external controllers. In some embodiments, the conductors 88 and 89 may be fabricated using metals, such as aluminum, Cu, W or other common conductor materials.

The APD device 61 ensures separation of the absorbing body 62 from the avalanche or multiplication region 73 in the device layer 65 for low noise APD behavior. Moreover, the crystal quality of the absorbing body 62, e.g. germanium, may be preserved by production via epitaxy, free from degradation which would be caused by ion implantation or metal contacting.

The steps used to fabricate the APD device 61 may include: first, produce all of the doped/undoped regions 63 and 71-74 in the device layer 65 on a substrate 78/lower cladding 79 support, and then provide the upper cladding layer 87. The absorbing body 62 may then be deposited in an aperture produced, e.g. etched, in the cladding layer 87. One or more layers may be deposited over the absorbing body 62 to provide mechanical protection and/or optical coatings, such as anti-reflection coatings. The metallization, e.g. electrical conductors 88 and 89, and p and n terminals 91 and 92 may then be applied.

The foregoing description of one or more embodiments of the invention has been presented for the purposes of illustration and description. It is not intended to be exhaustive or to limit the invention to the precise form disclosed. Many modifications and variations are possible in light of the above teaching. It is intended that the scope of the invention be limited not by this detailed description, but rather by the claims appended hereto.

We claim:

1. A photodetector comprising:
   a waveguide absorption region for mounting in a device layer of a photonic integrated circuit (PIC) for transmitting an optical signal;
   a p-type contact in the device layer on one side of the waveguide absorption region, the p-type contact comprising a first p-type portion including a first p-type doping concentration and a second p-type portion including a second higher p-type doping concentration adjacent to the first p-type portion;
   an n-type contact in the device layer on an opposite side of the waveguide absorption region, the n-type contact comprising a first n-type portion including a first n-type doping concentration adjacent to the waveguide absorption region, and a second n-type portion including a second higher n-type doping concentration adjacent to the first n-type portion;
   an absorbing body on top of the waveguide absorption region for converting the optical signal to an electrical signal, the absorbing body including a first sidewall portion including a p-type dopant at least partially overlapping the first p-type portion and not in contact with the second p-type portion, and a second sidewall portion including an n-type dopant at least partially overlapping the first n-type portion not in contact with the second n-type portion;
   a first terminal extending from the second p-type portion for transmitting the electrical signal to external circuitry; and
   a second terminal extending from the second n-type portion for transmitting the electrical signal to the external circuitry.

2. The photodetector according to claim 1, wherein the first sidewall portion includes a p-type doping concentration substantially the same as the first p-type portion of the p-type contact.

3. The photodetector according to claim 1, wherein the first sidewall portion includes a depth that is about 20% to 35% of a width of the absorbing body.

4. The photodetector according to claim 1, wherein the first sidewall portion includes a depth that is about 25% to 30% of a width of the absorbing body.

5. The photodetector according to claim 1, wherein the absorbing body includes an upper undoped region between the p-doped first side wall portion and the n-doped second side wall portion, which forms a lateral pin junction.

6. The photodetector according to claim 5, wherein the upper undoped region includes a width that is about 30% to 60% of a width of the absorbing body.

7. The photodetector according to claim 5, wherein the upper undoped region includes a width that is about 40% to 50% of a width of the absorbing body.

8. The photodetector according to claim 1, wherein the absorbing body comprises a triangular shaped structure, a pyramidal-shaped structure or a frustum-shaped structure with sidewall surfaces extending at an acute angle from the device layer.

9. The photodetector according to claim 8, wherein the sidewall surfaces extending at an acute angle of 20° to 60° from the device layer.

10. The photodetector according to claim 1, wherein the second p-type portion includes a doping concentration 5× to 20× more than the first p-type portion.

11. The photodetector according to claim 1, wherein the second p-type portion includes a doping concentration at least 10× more than the first p-type portion.

12. The photodetector according to claim 1, wherein the second p-type portion includes a doping concentration of $5 \times 10^{18}$ cm$^{-3}$ to $1 \times 10^{20}$ cm$^{-3}$.

13. The photodetector according to claim 1, wherein the second p-type portion includes a doping concentration of substantially $1 \times 10^{19}$ cm$^{-3}$.

14. The photodetector according to claim 1, wherein the first p-type contact also includes a third p-type portion between the first and second p-type portions.

15. The photodetector according to claim 14, wherein the third p-type portion includes a doping concentration between doping concentrations of the first and second p-type portions.

16. The photodetector according to claim 14, wherein the third p-type portion includes a doping concentration substantially the same as the doping concentration of the second p-type portion.

17. The photodetector according to claim 14, wherein the third p-type portion includes a depth shorter than the first and second p-type portions.

18. The photodetector according to claim 1, wherein the absorbing body comprises germanium.

19. A photodetector comprising:
   a waveguide absorption region in a device layer of a photonic integrated circuit (PIC) for transmitting an optical signal;
   a p-type contact in the device layer on one side of the waveguide absorption region, the p-type contact comprising a first p-type portion including a first p-type doping concentration;
   a charge region in the device layer on an opposite side of the waveguide absorption region including a second lower p-type doping concentration;
   an avalanche region in the device layer adjacent to the charge region;
   a n-type contact in the device layer adjacent to the charge region, the n-type contact comprising a first n-type portion including a first n-type doping concentration;
   an absorbing body on top of the waveguide absorption region for converting the optical signal to an electrical signal, the absorbing body including a first sidewall portion including a p-type dopant at least partially overlapping the first p-type portion;
   a first terminal extending from the p-type contact for transmitting the electrical signal to external circuitry; and
   a second terminal extending from the n-type contact for transmitting the electrical signal to external circuitry.

20. The photodetector according to claim 19, wherein the first sidewall portion includes a depth that is about 20% to 35% of a width of the absorbing body.

* * * * *